United States Patent
Park

(10) Patent No.: US 9,646,658 B1
(45) Date of Patent: May 9, 2017

(54) SENSE AMPLIFIER AND MEMORY APPARATUS USING THE SAME

(71) Applicant: SK hynix Inc., Icheon-si, Gyeonggi-do (KR)

(72) Inventor: Kang Woo Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/221,831

(22) Filed: Jul. 28, 2016

(30) Foreign Application Priority Data

Mar. 2, 2016 (KR) ........................ 10-2016-0025169

(51) Int. Cl.
| | | |
|---|---|---|
| *G11C 7/10* | (2006.01) | |
| *G11C 7/06* | (2006.01) | |
| *G11C 7/12* | (2006.01) | |
| *G11C 7/22* | (2006.01) | |
| *G11C 8/10* | (2006.01) | |

(52) U.S. Cl.
CPC ............. *G11C 7/065* (2013.01); *G11C 7/12* (2013.01); *G11C 7/22* (2013.01); *G11C 8/10* (2013.01)

(58) Field of Classification Search
CPC .. G11C 7/065; G11C 7/12; G11C 7/22; G11C 8/10
See application file for complete search history.

(56) References Cited

U.S. PATENT DOCUMENTS

| | | | | |
|---|---|---|---|---|
| 6,687,175 B1* | 2/2004 | Mizuno | ................... | G11C 7/04 365/203 |
| 2003/0193824 A1* | 10/2003 | Tsukikawa | ............ | G11C 11/406 365/149 |
| 2008/0198680 A1* | 8/2008 | Park | ..................... | G11C 7/1048 365/230.03 |
| 2008/0285364 A1* | 11/2008 | Kim | ....................... | G11C 7/065 365/193 |
| 2011/0149667 A1* | 6/2011 | Hamzaoglu | ........... | G11C 11/413 365/203 |
| 2011/0305098 A1* | 12/2011 | Choi | ..................... | G11C 11/406 365/203 |
| 2015/0255128 A1* | 9/2015 | Kim | ........................ | G11C 7/08 365/193 |

FOREIGN PATENT DOCUMENTS

KR          101095829 B1    12/2011

* cited by examiner

*Primary Examiner* — Toan Le
(74) *Attorney, Agent, or Firm* — William Park & Associates Ltd.

(57) ABSTRACT

A sense amplifier includes a first input circuit, a second input circuit and an amplification circuit. The first input circuit may receive a pair of first input signals and change voltage levels of amplification nodes. The second input circuit may receive a pair of second input signals and change voltage levels of the amplification nodes. The amplification circuit may receive a first voltage, amplify voltage level changes of the amplification nodes, and output a pair of output signals through output nodes.

20 Claims, 6 Drawing Sheets

SENSE AMPLIFIER AND MEMORY APPARATUS USING THE SAME

CROSS-REFERENCES TO RELATED APPLICATION

The present application claims priority under 35 U.S.C. §119(a) to Korean application number 10-2016-0025169 filed on Mar. 2, 2016, in the Korean Intellectual Property Office, which is incorporated herein by reference in its entirety.

BACKGROUND

1. Technical Field

Various embodiments generally relate to a semiconductor apparatus, and, more particularly, to a sense amplifier and a memory apparatus using the same.

2. Related Art

The recent advances in semiconductor technology have enabled a high-speed, high-precision semiconductor apparatus to operate with reduced power consumption and to have a smaller circuit area. In reality, however, the design of a semiconductor apparatus is a trade-off between power consumption circuit area and high speed/high precision. Therefore, semiconductor designers are still putting a great deal of efforts to realize a miniaturized, low-power semiconductor apparatus.

In general, a semiconductor apparatus may include a driver and/or a sense amplifier to transmit a signal through a signal line or a bus. For example, a memory apparatus may include a sense amplifier to output data of a plurality of memory cells to a data transmission line. In a known semiconductor apparatus, the circuit area can be reduced by allowing two or more memory cells to share a sense amplifier. However, in this case, because of an increase in a load on the sense amplifier coupled to the plurality of memory cells, it may be difficult to precisely sense data signals.

SUMMARY

In an embodiment, a sense amplifier may include a first input circuit, a second input circuit, and an amplification circuit. The first input circuit may receive a pair of first input signals, and change voltage levels of amplification nodes. The second input circuit may receive a pair of second input signals, and change voltage levels of the amplification nodes. The amplification circuit may receive a first voltage, amplify voltage level changes of the amplification nodes, and output a pair of output signals through output nodes.

In an embodiment, a sense amplifier may include a first input circuit, a second input circuit, and an amplification circuit. The first input circuit may couple a first input node, which receives a first input signal, and a second input node, which receives a complementary signal of the first input signal, to amplification nodes, based on strobe signals. The second input circuit may couple a third input node, which receives a second input signal, and a fourth input node, which receives a complementary signal of the second input signal, to the amplification nodes, based on the strobe signals. The amplification circuit may amplify voltage level changes of the amplification nodes and output a pair of output signals through output nodes.

In an embodiment, a memory apparatus may include a plurality of first latch circuits, a plurality of second latch circuits, and a shared sense amplifier. The plurality of first latch circuits may latch data output from memory cells disposed in a first region of a first memory cell array, and may generate a pair of first input signals in response to column select signals. The plurality of second latch circuits may latch data output from memory cells disposed in a second region of the first memory cell array, and may generate a pair of second input signals in response to the column select signals. The shared sense amplifier may be coupled to the plurality of first latch circuits and the plurality of second latch circuits. The shared sense amplifier may include a plurality of first latch circuits, a plurality of second latch circuits, and a shared sense amplifier. The first input circuit may receive the pair of first input signals and change voltage levels of amplification nodes. The second input circuit may receive the pair of second input signals and change voltage levels of the amplification nodes. The amplification circuit may receive a first voltage, amplify voltage level changes of the amplification nodes, and output a pair of output signals through output nodes.

DETAILED DESCRIPTION

Hereinafter, a sense amplifier and a memory apparatus using the same will be described below with reference to the accompanying drawings through various examples of embodiments.

Embodiments may provide a sense amplifier which includes a plurality of input circuits to reduce a loading and is coupled in common to a plurality of regions of a memory cell array, and a memory apparatus using the same.

Figure 1:
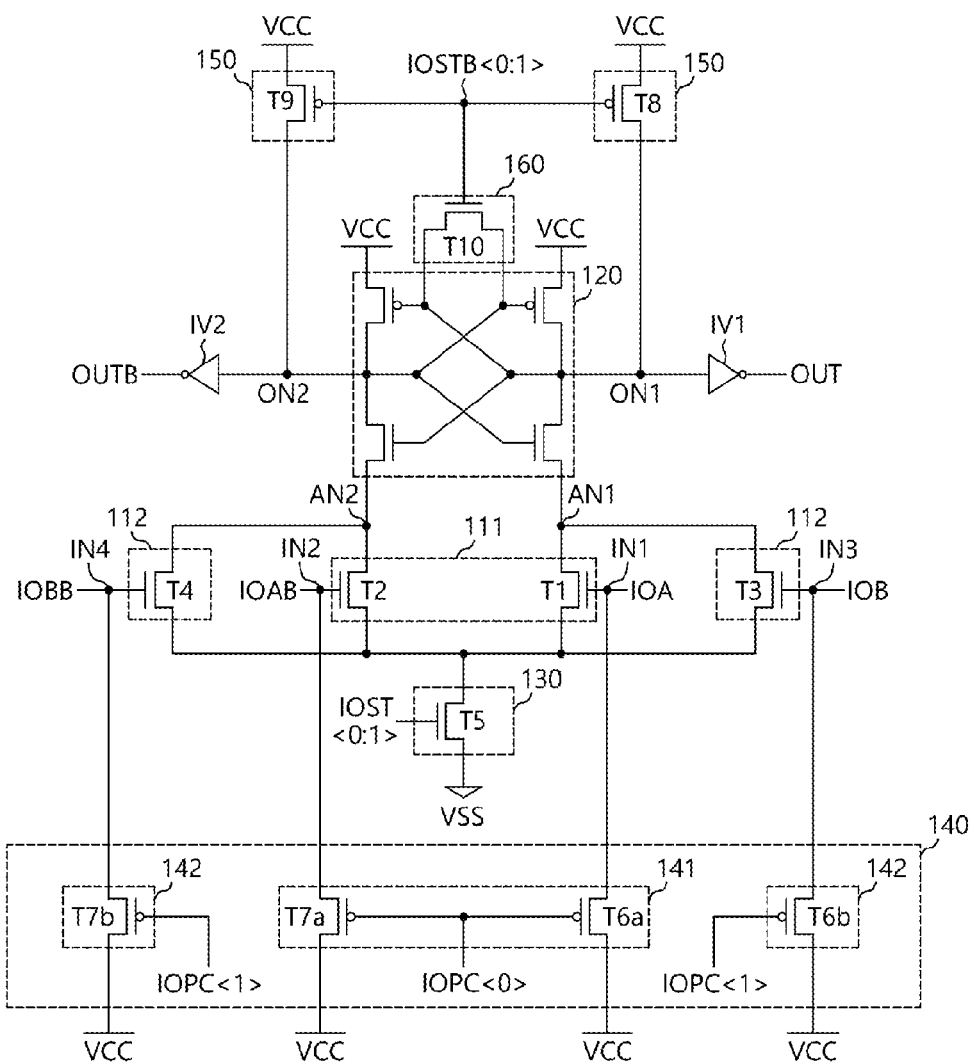
FIG. 1 is a diagram illustrating an example configuration of a sense amplifier in accordance with an embodiment.

FIG. 1 is a diagram illustrating an example configuration of a sense amplifier 100 in accordance with an embodiment. The sense amplifier 100 according to an embodiment of the present embodiment may receive two pairs of input signals, and may generate one pair of output signals based on the two pairs of input signals. The two pairs of input signals may be provided from different regions of the memory cell array. The sense amplifier 100 may not be coupled simultaneously to the different regions of the memory cell array. The sense amplifier 100 may not receive the two pairs of input signals output from the different regions of the memory cell array at the same time. For example, the sense amplifier 100 may generate the pair of output signals by amplifying one pair of input signals when the sense amplifier 100 is coupled to a first region, and may generate the pair of output signals by amplifying the other pair of input signals when the sense amplifier 100 is coupled to a second region.

In FIG. 1, the sense amplifier 100 may include a first input circuit 111, a second input circuit 112, and an amplification circuit 120. The first input circuit 111 may receive a pair of first input signals IOA and IOAB, and may change the voltage levels of amplification nodes AN1 and AN2. The pair of first input signals IOA and IOAB may include a first input signal IOA and a complementary signal IOAB of the first input signal IOA. The first input signal IOA may be received from a first input node IN1, and the complementary signal IOAB of the first input signal IOA may be received from a second input node IN2. The first input circuit 111 may change the voltage levels of the amplification nodes AN1 and AN2 depending upon a voltage level difference of the pair of first input signals IOA and IOAB. The amplification nodes AN1 and AN2 may include a first amplification node AN1 and a second amplification node AN2. For example, when the first input signal IOA is at a logic high level, the complementary signal IOAB of the first input signal IOA may be at a logic low level, and the first input circuit 111 may lower the voltage level of the first amplification node AN1 to a lower voltage level than the voltage level of the second amplification node AN2. When the first input signal IOA is at a logic low level, the complementary signal IOAB of the first input signal IOA may be at a logic high level, and the first input circuit 111 may raise the voltage level of the first amplification node AN1 to a higher voltage level than the voltage level of the second amplification node AN2.

The second input circuit 112 may receive a pair of second input signals IOB and IOBB, and may change the voltage levels of the amplification nodes AN1 and AN2. The pair of second input signals IOB and IOBB may include a second input signal IOB and a complementary signal IOBB of the second input signal IOB. The second input signal IOB may be received from a third input node IN3, and the complementary signal IOBB of the second input signal IOB may be received from a fourth input node IN4. The second input circuit 112 may change the voltage levels of the amplification nodes AN1 and AN2 depending upon the voltage level difference of the pair of second input signals IOB and IOBB. For example, when the second input signal IOB is at a logic high level, the complementary signal IOBB of the second input signal IOB may be at a logic low level, and the second input circuit 112 may lower the voltage level of the first amplification node AN1 to a lower voltage level than the voltage level of the second amplification node AN2. When the second input signal IOB is at a logic low level, the complementary signal IOBB of the second input signal IOB may be at a logic high level, and the second input circuit 112 may raise the voltage level of the first amplification node AN1 to a higher voltage level than the voltage level of the second amplification node AN2.

The amplification circuit 120 may amplify the voltage level changes of the amplification nodes AN1 and AN2, and may generate a pair of output signals OUT and OUTB. The pair of output signals OUT and OUTB may be output through output nodes ON1 and ON2. The amplification circuit 120 may receive a first voltage VCC. The amplification circuit 120 may provide the first voltage VCC to the first and second input circuits 111 and 112, and may generate the pair of output signals OUT and OUTB by amplifying the voltage level changes of the amplification nodes AN1 and AN2 when the voltage level changes are induced by the first and second input circuits 111 and 112. The pair of output signals OUT and OUTB may include a first output signal OUT and a second output signal OUTB. The second output signal OUTB may be a complementary signal of the first output signal OUT. The output nodes ON1 and ON2 may include a first output node ON1 and a second output node ON2. The first output signal OUT may be generated from the first output node ON1, and the second output signal OUTB may be generated from the second output node ON2. For example, the first output signal OUT may be output from an inverter IV1, and may be generated by inverting a voltage level of the first output node ON1, and the second output signal OUTB may be output from an inverter IV2, and may be generated by inverting a voltage level of the second output node ON2. The amplification circuit 120 may receive the first voltage VCC and change the voltage levels of the first and second output nodes ON1 and ON2 depending upon the voltage level changes of the first and second amplification nodes AN1 and AN2. The amplification circuit 120 may include a cross-coupled latch circuit.

In FIG. 1, the first input circuit 111 may include a first input transistor T1 and a second input transistor T2. The first and second input transistors T1 and T2 may be, for example, N-channel MOS transistors. The first input transistor T1 may receive the first input signal IOA from the first input node IN1, and may couple the first amplification node AN1 to a voltage terminal for applying a second voltage VSS. In an embodiment, the first voltage VCC may be a high voltage, and the second voltage VSS may be a low voltage. For example, the first voltage VCC may be a power supply voltage, and the second voltage VSS may be a ground voltage. The first input transistor T1 may have a gate receiving the first input signal IOA, a drain coupled to the first amplification node AN1, and a source coupled to the voltage terminal for applying the second voltage VSS.

The second input transistor T2 may receive the complementary signal IOAB of the first input signal IOA from the second input node IN2, and may couple the second amplification node AN2 to the voltage terminal for applying the second voltage VSS. The second input transistor T2 may have a gate receiving the complementary signal IOAB of the first input signal IOA, a drain coupled to the second amplification node AN2, and a source coupled to the voltage terminal for applying the second voltage VSS.

The second input circuit 112 may include a third input transistor T3 and a fourth input transistor T4. The third and fourth input transistors T3 and T4 may be, for example, N-channel MOS transistors. The third input transistor T3 may receive the second input signal IOB from the third input node IN3, and may couple the first amplification node AN1 and the voltage terminal for applying the second voltage VSS. The first input transistor T3 may have a gate receiving the second input signal IOB, a drain coupled to the first amplification node AN1, and a source coupled to the voltage terminal for applying the second voltage VSS.

The fourth input transistor T4 may receive the complementary signal IOBB of the second input signal IOB from the fourth input node IN4, and may couple the second amplification node AN2 to the voltage terminal for applying the second voltage VSS. The fourth input transistor T4 may have a gate receiving the complementary signal IOBB of the second input signal IOB, a drain coupled to the second amplification node AN2, and a source coupled to the voltage terminal for applying the second voltage VSS.

In FIG. 1, the sense amplifier 100 may further include a first sense amplifier enable circuit 130. The first sense amplifier enable circuit 130 may enable the sense amplifier 100 based on strobe signals IOST<0:1>. The first sense amplifier enable circuit 130 may couple the first and second input circuits 111 and 112 to the voltage terminal for applying the second voltage VSS, based on the strobe signals IOST<0:1>. The strobe signals IOST<0:1> may be signals that are generated in the form of pulses to operate the sense amplifier 100. The strobe signals IOST<0:1> may include a first strobe signal IOST<0> and a second strobe signal IOST<1>. The first strobe signal IOST<0> may be generated to allow the sense amplifier 100 to receive the first input signal IOA and the complementary signal IOAB of the first input signal IOA. The first strobe signal IOST<0> may be generated in the form of a pulse to amplify the first input signal IOA and the complementary signal IOAB of the first input signal IOA. The second strobe signal IOST<1> may be generated to allow the sense amplifier 100 to receive the second input signal IOB and the complementary signal IOBB of the second input signal IOB. The second strobe signal IOST<1> may be generated in the form of a pulse to amplify the second input signal IOB and the complementary signal IOBB of the second input signal IOB. Therefore, the sense amplifier 100 may perform an amplification operation even when only one of the first and second strobe signals IOST<0:1> is enabled.

The first sense amplifier enable circuit 130 may include a fifth transistor T5. The fifth transistor T5 may be an N-channel MOS transistor. The fifth transistor T5 may have a gate receiving the strobe signals IOST<0:1>, a drain coupled in common to the first input circuit 111 and the second input circuit 112, and a source coupled to the voltage terminal for applying the second voltage VSS. The drain of the fifth transistor T5 may be coupled in common to the sources of the first to fourth input transistors T1, T2, T3 and T4.

In FIG. 1, the sense amplifier 100 may further include a first precharge circuit 140. The first precharge circuit 140 may precharge the first to fourth input nodes IN1, IN2, IN3 and IN4 with the first voltage VCC, based on precharge signals IOPC<0:1>. When the sense amplifier 100 is disabled, the first precharge circuit 140 may precharge the first to fourth input nodes IN1, IN2, IN3 and IN4 for a next amplification operation. The precharge signals IOPC<0:1> may be enabled when the strobe signals IOST<0:1> is disabled. The precharge signals IOPC<0:1> may include a first precharge signal IOPC<0> and a second precharge signal IOPC<1>. The first precharge signal IOPC<0> may be generated when the first strobe signal IOST<0> is disabled, and the second precharge signal IOPC<1> may be generated when the second strobe signal IOST<1> is disabled.

The first precharge circuit 140 may include a first sub precharge section 141 and a second sub precharge section 142. The first sub precharge section 141 may precharge the first and second input nodes IN1 and IN2 with the first voltage VCC, based on the first precharge signal IOPC<0>. The second sub precharge section 142 may precharge the third and fourth input nodes IN3 and IN4 with the first voltage VCC, based on the second precharge signal IOPC<1>. The first precharge circuit 140 may include two or more sub precharge sections to spread load of the sense amplifier 100. For example, the first precharge circuit 140 may include the first sub precharge section 141, which precharges the first and second input nodes IN1 and IN2, and the second sub precharge section 142, which precharges the third and fourth input nodes IN3 and IN4.

The first sub precharge section 141 may include a first-sixth transistor T6a and a first-seventh transistor T7a. The first-sixth and first-seventh transistors T6a and T7a may be P-channel MOS transistors. The first-sixth transistor T6a may have a gate receiving the first precharge signal IOPC<0>, a drain coupled to the first input node IN1, and a source receiving the first voltage VCC. The first-seventh transistor T7a may have a gate receiving the first precharge signal IOPC<0>, a drain coupled to the second input node IN2, and a source receiving the first voltage VCC. The second sub precharge section 142 may include a second-sixth transistor T6b and a second-seventh transistor T7b. The second-sixth and second-seventh transistors T6b and T7b may be P-channel MOS transistors. The second-sixth transistor T6b may have a gate receiving the second precharge signal IOPC<1>, a drain coupled to the third input node IN3, and a source receiving the first voltage VCC. The second-seventh transistor T7b may have a gate receiving the second precharge signal IOPC<1>, a drain coupled to the fourth input node IN4, and a source receiving the first voltage VCC.

In FIG. 1, the sense amplifier 100 may further include a second sense amplifier enable circuit 150. The second sense amplifier enable circuit 150 may provide the first voltage VCC to the output nodes ON1 and ON2, based on the strobe signals IOST<0:1>. The second sense amplifier enable circuit 150 may provide the first voltage VCC to the first and second output nodes ON1 and ON2 in response to complementary signals IOSTB<0:1> of the strobe signals IOST<0:1>. The second sense amplifier enable circuit 150 may provide the first voltage VCC to the first and second output nodes ON1 and ON2 when the sense amplifier 100 is enabled, such that the voltage levels of the first and second output nodes ON1 and ON2 may be determined according to the amplification operation of the amplification circuit 120. The second sense amplifier enable circuit 150 may block the first voltage VCC from being provided to the first and second output nodes ON1 and ON2 when the sense amplifier 100 is disabled. The second sense amplifier enable circuit 150 may include eighth and ninth transistors T8 and T9. The eighth and ninth transistors T8 and T9 may be P-channel MOS transistors. The eighth transistor T8 may have a gate receiving the complementary signals IOSTB<0:1> of the strobe signals IOST<0:1>, a source receiving the first voltage VCC, and a drain coupled to the first output node ON1. The ninth transistor T9 may have a gate receiving the complementary signals IOSTB<0:1> of the strobe signals IOST<0:1>, a source receiving the first voltage VCC, and a drain coupled to the second output node ON2.

In FIG. 1, the sense amplifier 100 may further include a second precharge circuit 160. The second precharge circuit 160 may precharge the amplification circuit 120, based on the strobe signals IOST<0:1>. The second precharge circuit 160 may provide the first voltage VCC in response to the complementary signals IOSTB<0:1> of the strobe signals IOST<0:1>, and may precharge the amplification circuit 120. The second precharge circuit 160 may include a tenth transistor T10. The tenth transistor T10 may be an N-channel MOS transistor. The tenth transistor T10 may have a gate receiving the complementary signals IOSTB<0:1> of the strobe signals IOST<0:1>, and may have a drain and a source which are coupled to the amplification circuit 120. The tenth transistor T10 may equalize the amplification circuit 120 when it is turned on by the complementary signals IOSTB<0:1> of the strobe signals IOST<0:1>.

The pair of first input signals IOA and IOAB and the pair of second input signals IOB and IOBB may not be input simultaneously. The third and fourth input nodes IN3 and IN4 may be precharged when the first input signals IOA and IOAB are input, and the first and second input nodes IN1 and IN2 may be precharged when the second input signals IOB and IOBB are input. Therefore, while the sense amplifier 100 may receive both the pair of first input signals IOA and IOAB and the pair of second input signals IOB and IOBB, the sense amplifier 100 may amplify any one pair of signals and output the first and second output signals OUT and OUTB.

Figure 2:
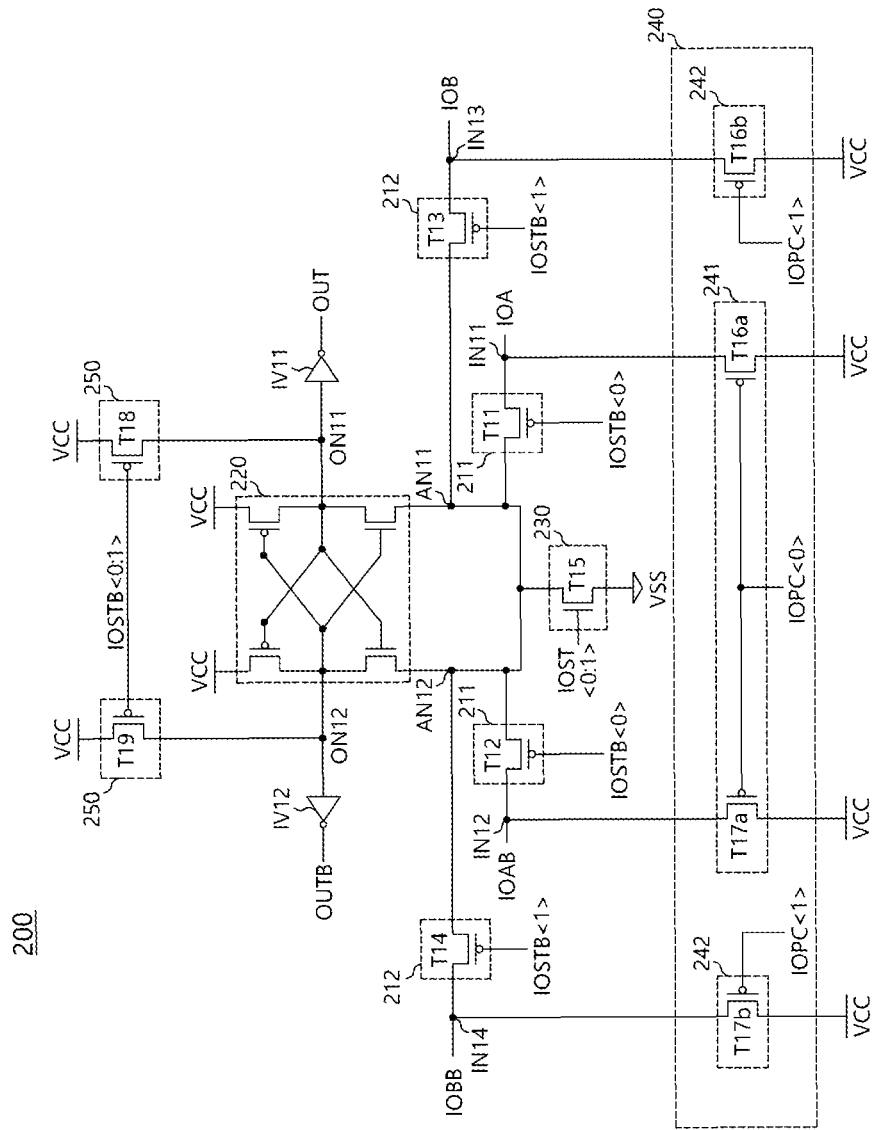
FIG. 2 is a diagram illustrating an example configuration of a sense amplifier in accordance with an embodiment.

FIG. 2 is a diagram illustrating an example configuration of a sense amplifier 200 in accordance with an embodiment. In FIG. 2, the sense amplifier 200 may include a first input circuit 211, a second input circuit 212, and an amplification circuit 220. The first input circuit 211 may receive a pair of first input signals IOA and IOAB, based on strobe signals IOST<0:1>. The strobe signals IOST<0:1> may include a first strobe signal IOST<0> and a second strobe signal IOST<1>. In response to a complementary signal IOSTB<0> of the first strobe signal IOST<0>, the first input circuit 211 may couple a first input node IN11, which receives the first input signal IOA, and a second input node IN12, which receives the complementary signal IOAB of the first input signal IOA, to amplification nodes AN11 and AN12. The first input circuit 211 may couple the first input node IN11 to the first amplification node AN11 in response to the complementary signal IOSTB<0> of the first strobe signal IOST<0>. Also, the first input circuit 211 may couple the second input node IN12 to the second amplification node AN12 in response to the complementary signal IOSTB<0> of the first strobe signal IOST<0>. The first input circuit 211 may provide the pair of first input signals IOA and IOAB to the first and second amplification nodes AN11 and AN12, respectively, when the complementary signal IOSTB<0> of the first strobe signal IOST<0> is enabled, and thereby may change the voltage levels of the first and second amplification nodes AN11 and AN12.

The second input circuit 212 may receive a pair of second input signals IOB and IOBB, based on the strobe signals IOST<0:1>. In response to a complementary signal IOSTB<1> of the second strobe signal IOST<1>, the second input circuit 212 may couple a third input node IN13, which receives the second input signal IOB, and a fourth input node IN14, which receives the complementary signal IOBB of the second input signal IOB, to the amplification nodes AN11 and AN12. The second input circuit 212 may couple the third input node IN13 to the first amplification node AN11 in response to the complementary signal IOSTB<1> of the second strobe signal IOST<1>. Also, the second input circuit 212 may couple the fourth input node IN14 to the second amplification node AN12 in response to the complementary signal IOSTB<1> of the second strobe signal IOST<1>. The second input circuit 212 may provide the pair of second input signals IOB and IOBB to the first and second amplification nodes AN11 and AN12, respectively, when the complementary signal IOSTB<1> of the second strobe signal IOST<1> is enabled, and thereby may change the voltage levels of the first and second amplification nodes AN11 and AN12.

The amplification circuit 220 may amplify the voltage level changes of the amplification nodes AN11 and AN12, and may generate a pair of output signals OUT and OUTB. The amplification circuit 220 may change the voltage levels of output nodes ON11 and ON12 depending upon the voltage level changes of the amplification nodes AN11 and AN12. The pair of output signals OUT and OUTB may be generated from the output nodes ON11 and ON12. The first output signal OUT may be generated at an inverter IV11 by inverting a signal generated from the first output node ON11. The second output signal OUTB may be generated at an inverter IV12 by inverting a signal generated from the second output node ON12. The amplification circuit 220 may be a cross-coupled latch circuit.

In FIG. 2, the first input circuit 211 may include a first input transistor T11 and a second input transistor T12. The first and second input transistors T11 and T12 may be P-channel MOS transistors. The first input transistor T11 may couple the first input node IN11 to the first amplification node AN11, based on the first strobe signal IOST<0>. The first input transistor T11 may have a gate receiving the complementary signal IOSTB<0> of the first strobe signal IOST<0>, and a source and a drain one of which receives the first input signal IOA and the other of which is coupled to the first amplification node AN11. The second input transistor T12 may couple the second input node IN12 to the second amplification node AN12, based on the first strobe signal IOST<0>. The second input transistor T12 may have a gate receiving the complementary signal IOSTB<0> of the first strobe signal IOST<0>, and a source and a drain one of which receives the complementary signal IOAB of the first input signal IOA and the other of which is coupled to the second amplification node AN12.

The second input circuit 212 may include a third input transistor T13 and a fourth input transistor T14. The third and fourth input transistors T13 and T14 may be P-channel MOS transistors. The third input transistor T13 may couple the third input node IN13 to the first amplification node AN11, based on the second strobe signal IOST<1>. The third input transistor T13 may have a gate receiving the complementary signal IOSTB<1> of the second strobe signal IOST<1>, and a source and a drain one of which receives the second input signal IOB and the other of which is coupled to the first amplification node AN11. The fourth input transistor T14 may couple the fourth input node IN14 to the second amplification node AN12, based on the second strobe signal IOST<1>. The fourth input transistor T14 may have a gate receiving the complementary signal IOSTB<1> of the second strobe signal IOST<1>, and a source and a drain one of which receives the complementary signal IOBB of the second input signal IOB and the other of which is coupled to the second amplification node AN12.

In FIG. 2, the sense amplifier 200 may further include a first sense amplifier enable circuit 230. The first sense amplifier enable circuit 230 may couple the first and second amplification nodes AN11 and AN12 to the voltage terminal for applying a second voltage VSS, based on the strobe signals IOST<0:1>. The first sense amplifier enable circuit 230 may include a fifth transistor T15. The fifth transistor T15 may be an N-channel MOS transistor. The fifth transistor T15 may have a gate receiving the strobe signals IOST<0:1>, a drain coupled in common to the first and second amplification nodes AN11 and AN12, and a source coupled to the voltage terminal for applying the second voltage VSS.

In FIG. 2, the sense amplifier 200 may further include a precharge circuit 240. The precharge circuit 240 may precharge the first to fourth input nodes IN11, IN12, IN13 and IN14 with a first voltage VCC, based on precharge signals IOPC<0:1>. The precharge circuit 240 may include a first sub precharge section 241 and a second sub precharge section 242. The first sub precharge section 241 may precharge the first and second input nodes IN11 and IN12 with the first voltage VCC, based on the first precharge signal IOPC<0>. The second sub precharge section 242 may precharge the third and fourth input nodes IN13 and IN14 with the first voltage VCC, based on the second precharge signal IOPC<1>.

The first sub precharge section 241 may include a first-sixth transistor T16a and a first-seventh transistor T17a. The first-sixth and first-seventh transistors T16a and T17a may be P-channel MOS transistors. The first-sixth transistor T16a may have a gate receiving the first precharge signal IOPC<0>, a source receiving the first voltage VCC, and a drain coupled to the first input node IN11. The first-seventh transistor T17a may have a gate receiving the first precharge signal IOPC<0>, a source receiving the first voltage VCC, and a drain coupled to the second input node IN12. The second sub precharge section 242 may include a second-sixth transistor T16*b* and a second-seventh transistor T17*b*. The second-sixth and second-seventh transistors T16*b* and T17*b* may be P-channel MOS transistors. The second-sixth transistor T16*b* may have a gate receiving the second precharge signal IOPC<1>, a source receiving the first voltage VCC, and a drain coupled to the third input node IN13. The seventh-second transistor T17*b* may have a gate receiving the second precharge signal IOPC<1>, a source receiving the first voltage VCC, and a drain coupled to the fourth input node IN14.

In FIG. 2, the sense amplifier 200 may further include a second sense amplifier enable circuit 250. The second sense amplifier enable circuit 250 may provide the first voltage VCC to the first and second output nodes ON11 and ON12, based on the strobe signals IOST<0:1>. The second sense amplifier enable circuit 250 may include an eighth transistor T18 and a ninth transistor T19. The eighth and ninth transistors T18 and T19 may be P-channel MOS transistors. The eighth transistor T18 may have a gate receiving the complementary signals IOSTB<0:1> of the strobe signals IOST<0:1>, a source receiving the first voltage VCC, and a drain coupled to the first output node ON11. The ninth transistor T19 may have a gate receiving the complementary signals IOSTB<0:1> of the strobe signals IOST<0:1>, a source receiving the first voltage VCC, and a drain coupled to the second output node ON12. The sense amplifier 200 may differ from the sense amplifier 100 illustrated in FIG. 1 in terms of the configuration scheme of input circuits, but may perform substantially the same operation as the sense amplifier 100.

Figure 3:
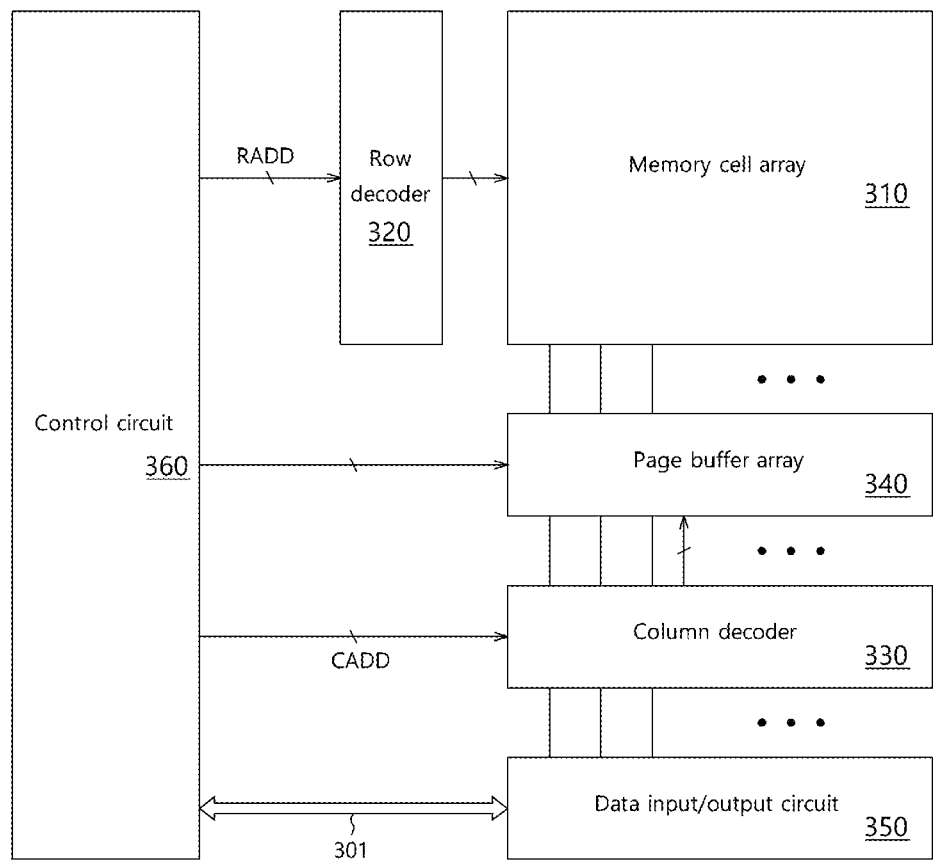
FIG. 3 is a diagram illustrating an example configuration of a memory apparatus in accordance with an embodiment.

FIG. 3 is a diagram illustrating an example configuration of a memory apparatus 3 in accordance with an embodiment. In FIG. 3, the memory apparatus 3 may include a memory cell array 310, a row decoder 320, a column decoder 330, a page buffer array 340, a data input/output circuit 350, and a control circuit 360. The memory cell array 310 may include a plurality of cell strings, and may include a plurality of word lines and a plurality of bit lines which are coupled to the plurality of cell strings. The row decoder 320 may select a word line coupled to a certain memory cell, based on a row address signal RADD. The column decoder 330 may select a bit line coupled to the certain memory cell, based on a column address signal CADD. The page buffer array 340 may store data in the memory cell accessed by the row decoder 320 and the column decoder 330, and may output the data stored in the memory cell. The page buffer array 340 may include a plurality of page buffers respectively coupled to the plurality of cell strings. The plurality of page buffers may include cache latch circuits capable of storing the data output from the plurality of cell strings respectively coupled thereto.

The data input/output circuit 350 may provide, to the page buffer array 340, the data input through data transmission lines 301, or may output, to the data transmission lines 301, the data output from the page buffer array 340. The data input/output circuit 350 may receive and amplify the data stored in the cache latch circuits of the plurality of page buffers which construct the page buffer array 340, and may output the amplified data to the data transmission lines 301. The data input/output circuit 350 may include the sense amplifier 100 illustrated in FIG. 1 and/or the sense amplifier 200 illustrated in FIG. 2.

The control circuit 360 may control the row decoder 320, the column decoder 330, the page buffer array 340, and the data input/output circuit 350. The control circuit 360 may include various logic circuits. For instance, the control circuit 360 may include a voltage supply circuit, a peripheral circuit, an initialization circuit, and so forth. The voltage supply circuit may generate and supply various voltages to be used in the memory apparatus 3. For example, the voltage supply circuit may generate a read voltage, a program voltage, an erase voltage and a word line voltage, and may generate internal voltages as power supply voltages for operating the internal circuits of the memory apparatus 3. The voltage supply circuit may receive at least one external voltage from an external device, and may generate various voltages.

The peripheral circuit may include various logic circuits for controlling the memory apparatus 3. For example, the peripheral circuit may include a data buffer, an address buffer, a chip enable circuit, and so forth. The initialization circuit may initialize the memory apparatus 3 when power is applied to the memory apparatus 3. The initialization circuit may sense the level of the power and generate an initialization signal.

Figure 4:
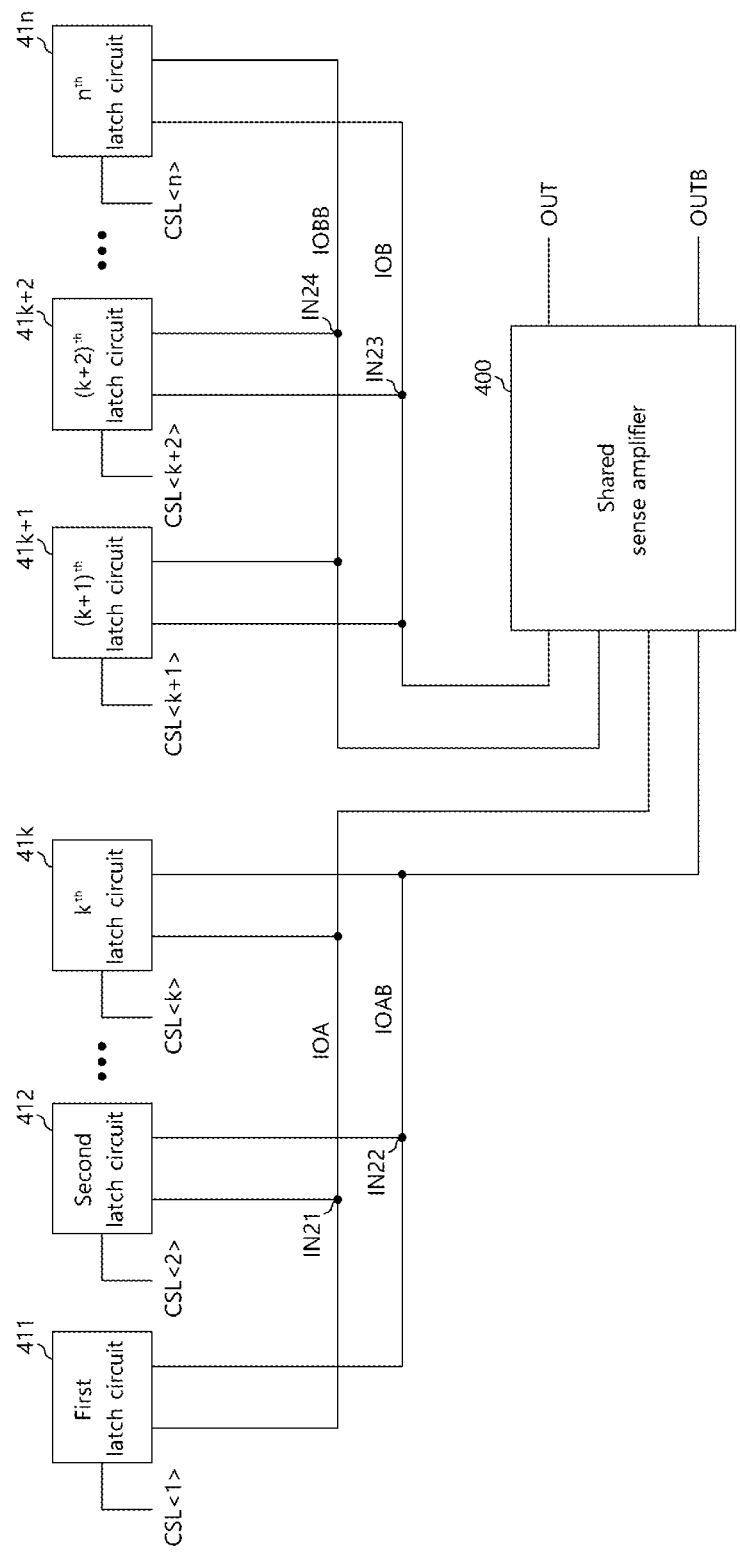
FIG. 4 is a diagram illustrating an example configuration of a memory apparatus in accordance with an embodiment.

FIG. 4 is a diagram illustrating an example configuration of a memory apparatus 4 in accordance with an embodiment. In FIG. 4, the memory apparatus 4 may include a shared sense amplifier 400 and a plurality of latch circuits 411, 412, . . . , 41*k*, 41*k*+1, 41*k*+2, . . . , and 41*n*. The shared sense amplifier 400 may receive two pairs of input signals and generate one pair of output signals. The concept of the sense amplifier 100 illustrated in FIG. 1 and/or the concept of the sense amplifier 200 illustrated in FIG. 2 may be applied to the shared sense amplifier 400. The shared sense amplifier 400 may be coupled in common to a first region and a second region of a certain memory cell array. The plurality of latch circuits 411, 412, . . . , 41*k*, 41*k*+1, 41*k*+2, . . . , and 41*n* may be cache latch circuits that store the data output from the certain memory cell array. The first to k^th latch circuits 411, 412, . . . , and 41*k* may be coupled to the cell strings and/or bit lines disposed in the first region of the memory cell array, and the (k+1)^th to n^th latch circuits 41*k*+1, 41*k*+2, . . . , and 41*n* may be coupled to the cell strings and/or bit lines disposed in the second region of the memory cell array. A pair of first input signals IOA and IOAB input to the shared sense amplifier 400 may be output from the first to k^th latch circuits 411, 412, . . . , and 41*k*. Further, a pair of second input signals IOB and IOBB input to the shared sense amplifier 400 may be output from the (k+1)^th to n^th latch circuits 41*k*+1, 41*k*+2, . . . , and 41*n*.

The first latch circuit 411 may be coupled to a first cell string and/or a first bit line among the plurality of cell strings and/or the plurality of bit lines of the memory cell array, the second latch circuit 412 may be coupled to a second cell string and/or a second bit line, and the k^th latch circuit 41*k* may be coupled to a k^th cell string and/or a k^th bit line. The (k+1)^th latch circuit 41*k*+1 may be coupled to a (k+1)^th cell string and/or a (k+1)^th bit line, the (k+2)^th latch circuit 41*k*+2 may be coupled to a (k+2)^th cell string and/or a (k+2)^th bit line, and the n^th latch circuit 41*n* may be coupled to an n^th cell string and/or an n^th bit line. The first to k^th latch circuits 411, 412, . . . , and 41*k* may be coupled in common to a first input node IN21 and a second input node IN22. The shared sense amplifier 400 may receive the pair of first input signals IOA and IOAB output from any one of the first to k^th latch circuits 411, 412, . . . , and 41*k*, through the first and second input nodes IN21 and IN22. The (k+1)^th to n^th latch circuits 41*k*+1, 41*k*+2, . . . , and 41*n* may be coupled in common to a third input node IN23 and a fourth input node IN24. The shared sense amplifier 400 may receive the pair of second input signals IOB and IOBB output from any one of the (k+1)^th to n^th latch circuits 41k+1, 41k+2, . . . , and 41n, through the third and fourth input nodes IN23 and IN24.

The first to n^th latch circuits 411, 412, . . . , 41k, 41k+1, 41k+2, . . . , and 41n may output stored signals according to first to n^th column select signals CSL<1>, CSL<2>, . . . , CSL<k>, CSL<k+1>, CSL<k+2>, . . . , and CSL<n>, respectively. For example, if the k^th column select signal CSL<k> is enabled, the shared sense amplifier 400 may receive the signals output from the k^th latch circuit 41k, as the pair of first input signals IOA and IOAB. If the (k+1)^th column select signal CSL<k+1> is enabled, the shared sense amplifier 400 may receive the signals output from the (k+1)^th latch circuit 41k+1, as the pair of second input signals IOB and IOBB. Since the first to n^th latch circuits 411, 412, . . . , 41k, 41k+1, 41k+2, . . . , and 41n are respectively coupled to the plurality of cell strings and/or the plurality of bit lines of the one memory cell array, only one of the first to n^th column select signals CSL<1>, CSL<2>, . . . , CSL<k>, CSL<k+1>, CSL<k+2>, . . . , and CSL<n> may be enabled in one read operation. Therefore, even though the shared sense amplifier 400 is coupled in common to the first to n^th latch circuits 411, 412, . . . , 41k, 41k+1, 41k+2, . . . , and 41n, the shared sense amplifier 400 may normally amplify the signals output from one of the first to n^th latch circuits 411, 412, . . . , 41k, 41k+1, 41k+2, . . . , and 41n, and may generate a pair of output signals OUT and OUTB. Moreover, since the first and second input nodes IN21 and IN22 are coupled to the first to k^th latch circuits 411, 412, . . . , and 41k and the third and fourth input nodes IN23 and IN24 decoupled from the first and second input nodes IN21 and IN22 are coupled to the (k+1)^th to n^th latch circuits 41k+1, 41k+2, . . . , and 41n, the loading of the shared sense amplifier 400 may be reduced by one half. Accordingly, since a plurality of latch circuits coupled to one memory cell array are coupled in common to one shared sense amplifier, a circuit area may be reduced. In addition, the shared sense amplifier 400 coupled in common to two or more independent regions of one memory cell array through two or more input circuits may reduce a loading, and may ensure a fast operating speed.

Figure 5:
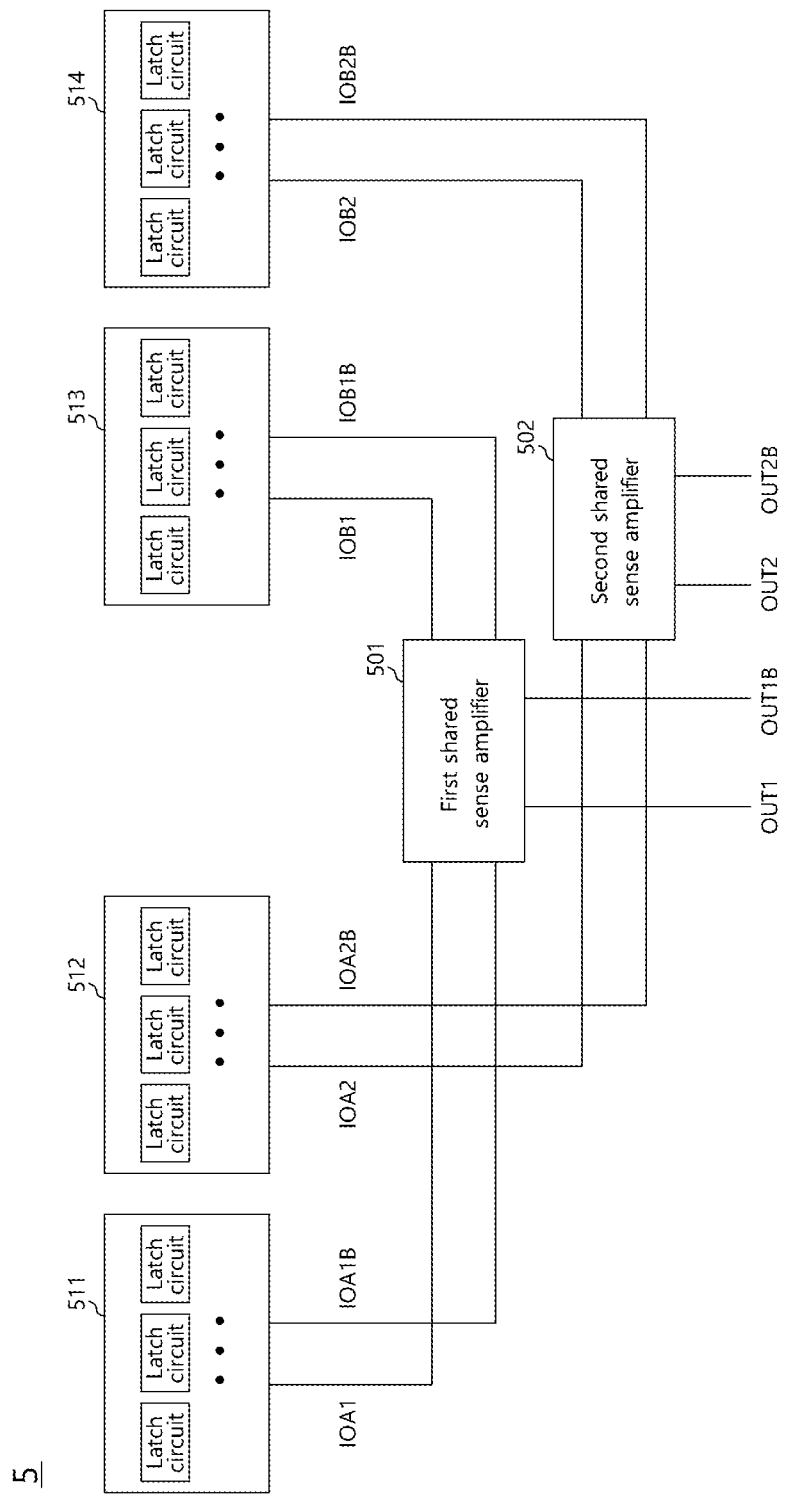
FIG. 5 is a diagram illustrating an example configuration of a memory apparatus in accordance with an embodiment.

FIG. 5 is a diagram illustrating an example configuration of a memory apparatus 5 in accordance with an embodiment. In FIG. 5, the memory apparatus 5 may include a first shared sense amplifier 501, a second shared sense amplifier 502, and first to fourth latch arrays 511, 512, 513 and 514. The first shared sense amplifier 501 may be coupled in common to the first and third latch arrays 511 and 513. The second shared sense amplifier 502 may be coupled in common to the second and fourth latch arrays 512 and 514. The concept of the sense amplifier 100 illustrated in FIG. 1 and/or the concept of the sense amplifier 200 illustrated in FIG. 2 may be applied to the first and second shared sense amplifiers 501 and 502. Each of the first to fourth latch arrays 511, 512, 513 and 514 may include a plurality of latch circuits. The latch circuits of the first latch array 511 may be coupled to the cell strings and/or bit lines disposed in a first region of a first memory cell array. The latch circuits of the second latch array 512 may be coupled to the cell strings and/or bit lines disposed in a first region of a second memory cell array. The latch circuits of the third latch array 513 may be coupled to the cell strings and/or bit lines disposed in a second region of the first memory cell array. The latch circuits of the fourth latch array 514 may be coupled to the cell strings and/or bit lines disposed in a second region of the second memory cell array.

The first shared sense amplifier 501 may receive in common the signals output from the first and second latch arrays 511 and 513 which are coupled to the first and second regions of the first memory cell array. The first shared sense amplifier 501 may receive the signals output from the first latch array 511, which is coupled to the first region of the first memory cell array, as a pair of first input signals IOA1 and IOA1B. The first shared sense amplifier 501 may receive the signals output from the third latch array 513, which is coupled to the second region of the first memory cell array, as a pair of second input signals IOB1 and IOB1B. The first shared sense amplifier 501 may amplify the pairs of first and second input signals IOA1, IOA1B, IOB1, IOB1B, and may generate a pair of first output signals OUT1 and OUT1B. The second shared sense amplifier 502 may receive in common the signals output from the second and fourth latch arrays 512 and 514 which are coupled to the first and second regions of the second memory cell array. The second shared sense amplifier 502 may receive the signals output from the second latch array 512, which is coupled to the first region of the second memory cell array, as a pair of first input signals IOA2 and IOA2B. The second shared sense amplifier 502 may receive the signals output from the fourth latch array 514, which is coupled to the second region of the second memory cell array, as a pair of second input signals IOB2 and IOB2B. The second shared sense amplifier 502 may amplify the pairs of first and second input signals IOA2, IOA2B, IOB2, IOB2B, and may generate a pair of second output signals OUT2 and OUT2B.

Signals may be simultaneously output from the first memory cell array and the second memory cell array during one read operation. At this time, only one latch circuit of the first and third latch arrays 511 and 513 may output signals, and only one latch circuit of the second and fourth latch arrays 512 and 514 may output signals. Therefore, the first shared sense amplifier 501 may normally amplify the signals output from the first memory cell array and generate the pair of first output signals OUT1 and OUT1B, and the second shared sense amplifier 502 may normally amplify the signals output from the second memory cell array and generate the pair of second output signals OUT2 and OUT2B. Shared sense amplifiers may be provided by a number corresponding to the number of memory cell arrays.

Figure 6:
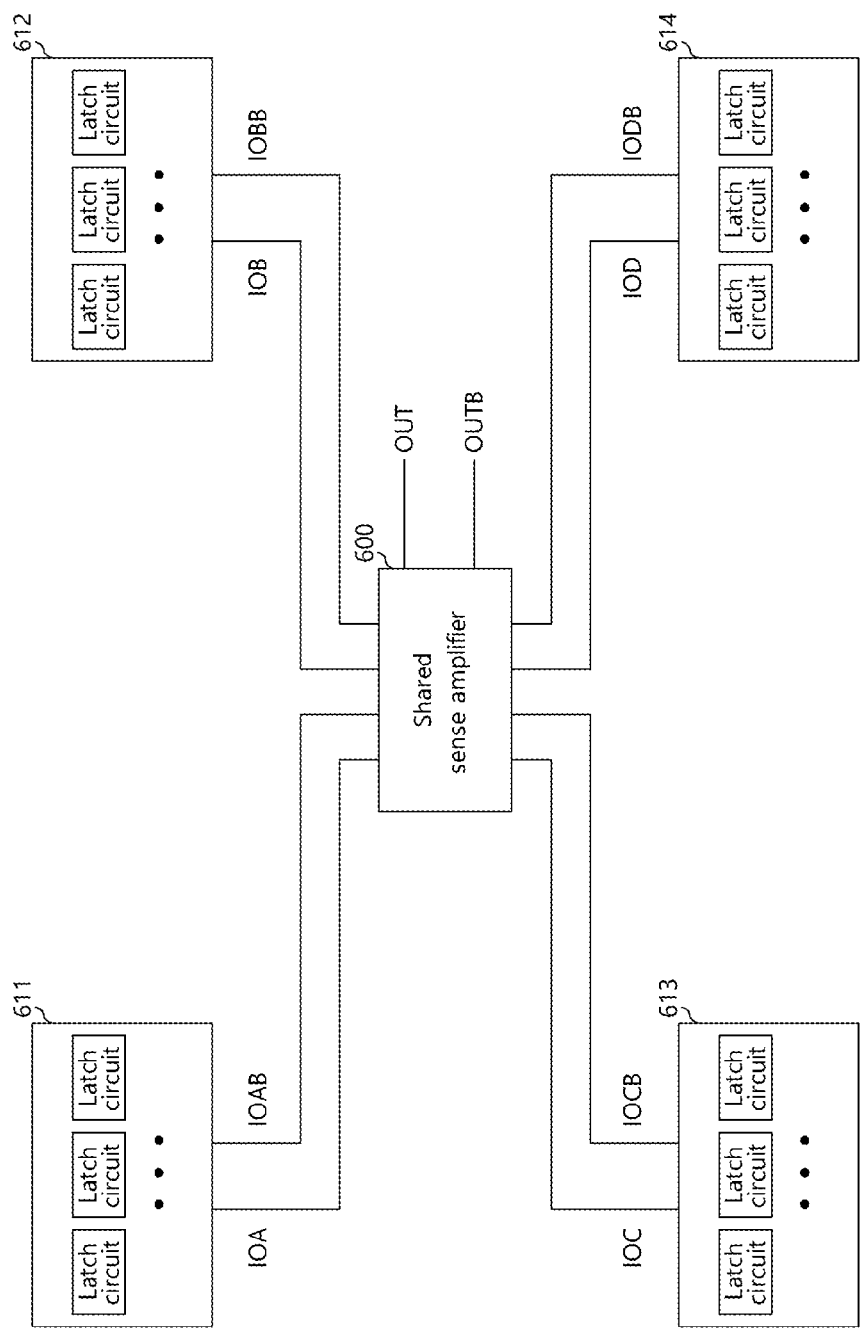
FIG. 6 is a diagram illustrating an example configuration of a memory apparatus in accordance with an embodiment.

FIG. 6 is a diagram illustrating an example configuration of a memory apparatus 6 in accordance with an embodiment. In FIG. 6, the memory apparatus 6 may include a shared sense amplifier 600, and first to fourth latch arrays 611, 612, 613 and 614. The shared sense amplifier 600 may receive four pairs of input signals. The shared sense amplifier 600 may be a modified type of the sense amplifier 100 illustrated in FIG. 1 and/or the sense amplifier 200 illustrated in FIG. 2. For example, the shared sense amplifier 600 may include four input circuits coupled between the amplification nodes AN1 and AN2 and the first sense amplifier enable circuit 130 in FIG. 1. The shared sense amplifier 600 may receive in common the four pairs of input signals, and may generate one pair of output signals. The first latch array 611 may include a plurality of latch circuits coupled to a first region of a first memory cell array, and may provide a pair of first input signals IOA and IOAB to the shared sense amplifier 600. The second latch array 612 may include a plurality of latch circuits coupled to a second region of the first memory cell array, and may provide a pair of second input signals IOB and IOBB to the shared sense amplifier 600. The third latch array 613 may include a plurality of latch circuits coupled to a first region of a second memory cell array, and may provide a pair of third input signals IOC and IOCB to the shared sense amplifier 600. The fourth latch array 614 may include a plurality of latch circuits coupled to a second region of the second memory cell array, and may provide a pair of fourth input signals IOD and IODB to the shared sense amplifier 600. The shared sense amplifier 600 may amplify any one pair of signals among the pairs of first to fourth input signals IOA, IOAB, IOB, IOBB, IOC, IOCB, IOD and IODB, and may generate a pair of output signals OUT and OUTB.

The second memory cell array may be stacked with the first memory cell array to form a 3-dimensional memory cell array structure. The first memory cell array and the second memory cell array may not be accessed simultaneously during one read operation. Therefore, the shared sense amplifier 600 may be coupled in common to two or more memory cell arrays without increasing the loading, and a circuit area may be reduced.

While various embodiments have been described above, it will be understood to those skilled in the art that the embodiments described are examples only. Accordingly, the sense amplifier and the memory apparatus using the same described herein should not be limited based on the described embodiments.

What is claimed is:

1. A sense amplifier comprising:
   a first input circuit configured to receive a pair of first input signals and change voltage levels of amplification nodes;
   a second input circuit configured to receive a pair of second input signals and change voltage levels of the amplification nodes; and
   an amplification circuit configured to receive a first voltage, amplify voltage level changes of the amplification nodes, and output a pair of output signals through output nodes.

2. The sense amplifier according to claim 1, wherein the first input circuit comprises:
   a first input transistor configured to receive a first input signal from a first input node and couple a first amplification node to a voltage terminal for applying a second voltage; and
   a second input transistor configured to receive a complementary signal of the first input signal from a second input node and couple a second amplification node to the voltage terminal for applying the second voltage.

3. The sense amplifier according to claim 2, wherein the second input circuit comprises:
   a third input transistor configured to receive a second input signal from a third input node and couple the first amplification node the voltage terminal for applying the second voltage; and
   a fourth input transistor configured to receive a complementary signal of the second input signal from a fourth input node and couple the second amplification node to the voltage terminal for applying the second voltage.

4. The sense amplifier according to claim 3, further comprising:
   a first precharge circuit configured to precharge the first to fourth input nodes with the first voltage, based on precharge signals.

5. The sense amplifier according to claim 4, wherein the first precharge circuit comprises:
   a first sub precharge section configured to precharge the first and second input nodes with the first voltage, based on a first precharge signal; and
   a second sub precharge section configured to precharge the third and fourth input nodes with the first voltage, based on a second precharge signal.

6. The sense amplifier according to claim 1, further comprising:
   a first sense amplifier enable circuit configured to couple the first and second input circuits to the voltage terminal for applying the second voltage, based on strobe signals.

7. A sense amplifier comprising:
   a first input circuit configured to couple a first input node, which receives a first input signal, and a second input node, which receives a complementary signal of the first input signal, to amplification nodes, based on strobe signals;
   a second input circuit configured to couple a third input node, which receives a second input signal, and a fourth input node, which receives a complementary signal of the second input signal, to the amplification nodes, based on the strobe signals; and
   an amplification circuit configured to amplify voltage level changes of the amplification nodes and output a pair of output signals through output nodes.

8. The sense amplifier according to claim 7, wherein the first input circuit comprises:
   a first input transistor configured to couple the first input node to a first amplification node, based on a first strobe signal; and
   a second input transistor configured to couple the second input node to a second amplification node, based on the first strobe signal.

9. The sense amplifier according to claim 8, wherein the second input circuit comprises:
   a third input transistor configured to couple the third input node to the first amplification node, based on a second strobe signal; and
   a fourth input transistor configured to couple the fourth input node to the second amplification node, based on the second strobe signal.

10. The sense amplifier according to claim 7, further comprising:
    a precharge circuit configured to precharge the first to fourth input nodes with a first voltage, based on precharge signals.

11. The sense amplifier according to claim 10, wherein the precharge circuit comprises:
    a first sub precharge section configured to precharge the first and second input nodes with the first voltage, based on a first precharge signal; and
    a second sub precharge section configured to precharge the third and fourth input nodes with the first voltage, based on a second precharge signal.

12. The sense amplifier according to claim 7, further comprising:
    a first sense amplifier enable circuit configured to couple the first and second input circuits to a voltage terminal for applying a second voltage, based on the strobe signals.

13. A memory apparatus comprising:
    a plurality of first latch circuits configured to latch data output from memory cells disposed in a first region of a first memory cell array, and generate a pair of first input signals based on column select signals;
    a plurality of second latch circuits configured to latch data output from memory cells disposed in a second region of the first memory cell array, and generate a pair of second input signals based on the column select signals; and a shared sense amplifier coupled to the plurality of first latch circuits and the plurality of second latch circuits, the shared sense amplifier comprising:

a first input circuit configured to receive the pair of first input signals and change voltage levels of amplification nodes;

a second input circuit configured to receive the pair of second input signals and change voltage levels of the amplification nodes; and an amplification circuit configured to receive a first voltage, amplify voltage level changes of the amplification nodes, and output a pair of output signals through output nodes.

14. The memory apparatus according to claim 13, wherein at least one of the pluralities of first and second latch circuits generate the pair of first input signals or the pair of second input signals in response to the column select signals.

15. The memory apparatus according to claim 13, wherein the first input circuit comprises:

a first input transistor coupled in common to the plurality of first latch circuits, and configured to couple a first amplification node to a voltage terminal for applying a second voltage in response to a first input signal; and a second input transistor coupled in common to the plurality of first latch circuits, and configured to couple a second amplification node to the voltage terminal for applying the second voltage in response to a complementary signal of the first input signal.

16. The memory apparatus according to claim 15, wherein the second input circuit comprises:

a third input transistor coupled in common to the plurality of second latch circuits, and configured to couple the first amplification node to the voltage terminal for applying the second voltage in response to a second input signal; and a fourth input transistor coupled in common to the plurality of second latch circuits, and configured to couple the second amplification node to the voltage terminal for applying the second voltage in response to a complementary signal of the second input signal.

17. The memory apparatus according to claim 16, further comprising:

a first sense amplifier enable circuit configured to couple the first and second input circuits to the voltage terminal for applying the second voltage, based on strobe signals.

18. The memory apparatus according to claim 13, further comprising:

a first precharge circuit configured to precharge input terminals of the first and second input circuits, with the first voltage, based on precharge signals.

19. The memory apparatus according to claim 18, wherein the first precharge circuit comprises:

a first sub precharge section configured to precharge the input terminal of the first input circuit with the first voltage, based on a first precharge signal; and a second sub precharge section configured to precharge the input terminal of the second input circuit with the first voltage, based on a second precharge signal.

20. The memory apparatus according to claim 13, further comprising:

a plurality of third latch circuits configured to latch data from memory cells disposed in a first region of a second memory cell array, and generate a pair of third input signals; and a plurality of fourth latch circuits configured to latch data from memory cells disposed in a second region of the second memory cell array, and generate a pair of fourth input signals, wherein the shared sense amplifier is coupled in common to the plurality of third latch circuits and the plurality of fourth latch circuits, further receives the pairs of third and fourth input signals, and generates the pair of output signals.

* * * * *